United States Patent
Murakami et al.

(10) Patent No.: US 7,898,448 B2
(45) Date of Patent: Mar. 1, 2011

(54) SIGMA-DELTA TYPE ANALOG-TO-DIGITAL (AD) CONVERTER AND ANGULAR VELOCITY SENSOR USING SAME

(75) Inventors: Hideyuki Murakami, Osaka (JP); Takashi Kawai, Fukui (JP); Kouji Nabetani, Fukui (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/523,769

(22) PCT Filed: Jan. 25, 2008

(86) PCT No.: PCT/JP2008/000087

§ 371 (c)(1),
(2), (4) Date: Jul. 20, 2009

(87) PCT Pub. No.: WO2008/090747

PCT Pub. Date: Jul. 31, 2008

(65) Prior Publication Data

US 2010/0013688 A1    Jan. 21, 2010

(30) Foreign Application Priority Data

Jan. 26, 2007  (JP)  ............... 2007-016017
Nov. 12, 2007  (JP)  ............... 2007-292830

(51) Int. Cl.
*H03M 3/00*  (2006.01)

(52) U.S. Cl. .............. 341/143; 341/141; 341/155; 341/172

(58) Field of Classification Search ........... 341/141, 341/143, 155, 172
See application file for complete search history.

(56) References Cited

U.S. PATENT DOCUMENTS

| | | | | |
|---|---|---|---|---|
| 4,588,981 A | * | 5/1986 | Senn | 341/143 |
| 5,245,343 A | * | 9/1993 | Greenwood et al. | 341/143 |
| 5,392,039 A | * | 2/1995 | Thurston | 341/143 |

(Continued)

FOREIGN PATENT DOCUMENTS

JP      7-249989      9/1995

(Continued)

OTHER PUBLICATIONS

International Search Report issued Mar. 4, 2008 in the International (PCT) Application of which the present application is the U.S. National Stage.

*Primary Examiner*—Linh V Nguyen
(74) *Attorney, Agent, or Firm*—Wenderoth, Lind & Ponack, L.L.P.

(57) ABSTRACT

An angular velocity sensor has a stable output characteristic using a sigma-delta type analog-to-digital converter. The sigma-delta type analog-to-digital converter includes an integrator unit for integrating electric charges output from an input switching device and a digital-to-analog converter unit, and holding at least two integrated values, a comparator unit for comparing at least the two integrated values output from the integrator unit with a predetermined value. The sigma-delta-type analog-to-digital converter also includes an arithmetic operation unit for operating an output signal of the comparator unit, the arithmetic operation unit being provided with a differential operation unit for computing a difference between at least two comparison signals output from comparator unit.

10 Claims, 7 Drawing Sheets

U.S. PATENT DOCUMENTS

| | | | |
|---|---|---|---|
| 5,644,308 A * | 7/1997 | Kerth et al. | 341/120 |
| 5,831,562 A * | 11/1998 | Van Auken et al. | 341/122 |
| 6,489,906 B2 * | 12/2002 | Matsumoto et al. | 341/143 |
| 6,507,302 B2 * | 1/2003 | Sakimura | 341/143 |
| 6,593,865 B2 * | 7/2003 | Nestler et al. | 341/141 |
| 7,030,796 B2 * | 4/2006 | Shim et al. | 341/141 |
| 7,362,255 B1 * | 4/2008 | Tsyrganovich | 341/172 |
| 7,466,257 B2 * | 12/2008 | Akizuki et al. | 341/143 |
| 7,504,977 B2 * | 3/2009 | Doorenbos et al. | 341/143 |
| 7,511,648 B2 * | 3/2009 | Trifonov et al. | 341/143 |
| 7,576,670 B2 * | 8/2009 | Clara et al. | 341/143 |
| 7,626,529 B2 * | 12/2009 | Robert | 341/155 |
| 2005/0204815 A1 | 9/2005 | Mase et al. | |
| 2007/0216557 A1 * | 9/2007 | Ebner et al. | 341/143 |

FOREIGN PATENT DOCUMENTS

JP     2001-237706     8/2001

* cited by examiner

SIGMA-DELTA TYPE ANALOG-TO-DIGITAL (AD) CONVERTER AND ANGULAR VELOCITY SENSOR USING SAME

This application is a U.S. national phase application of PCT International Application PCT/JP2008/000087, filed Jan. 25, 2008.

TECHNICAL FIELD

The present invention relates to a sigma-delta type analog-to-digital converter ("Σ-Δ type A/D converter") and an angular velocity sensor equipped with the converter that are used for such purposes as attitude control and a navigation system of a mobile object such as an aircraft or motor vehicle.

BACKGROUND ART

Referring to the accompanying drawing, a description is provided hereinafter of a conventional Σ-Δ type A/D converter of this kind capable of handling a plurality of input signals.

Figure 7:
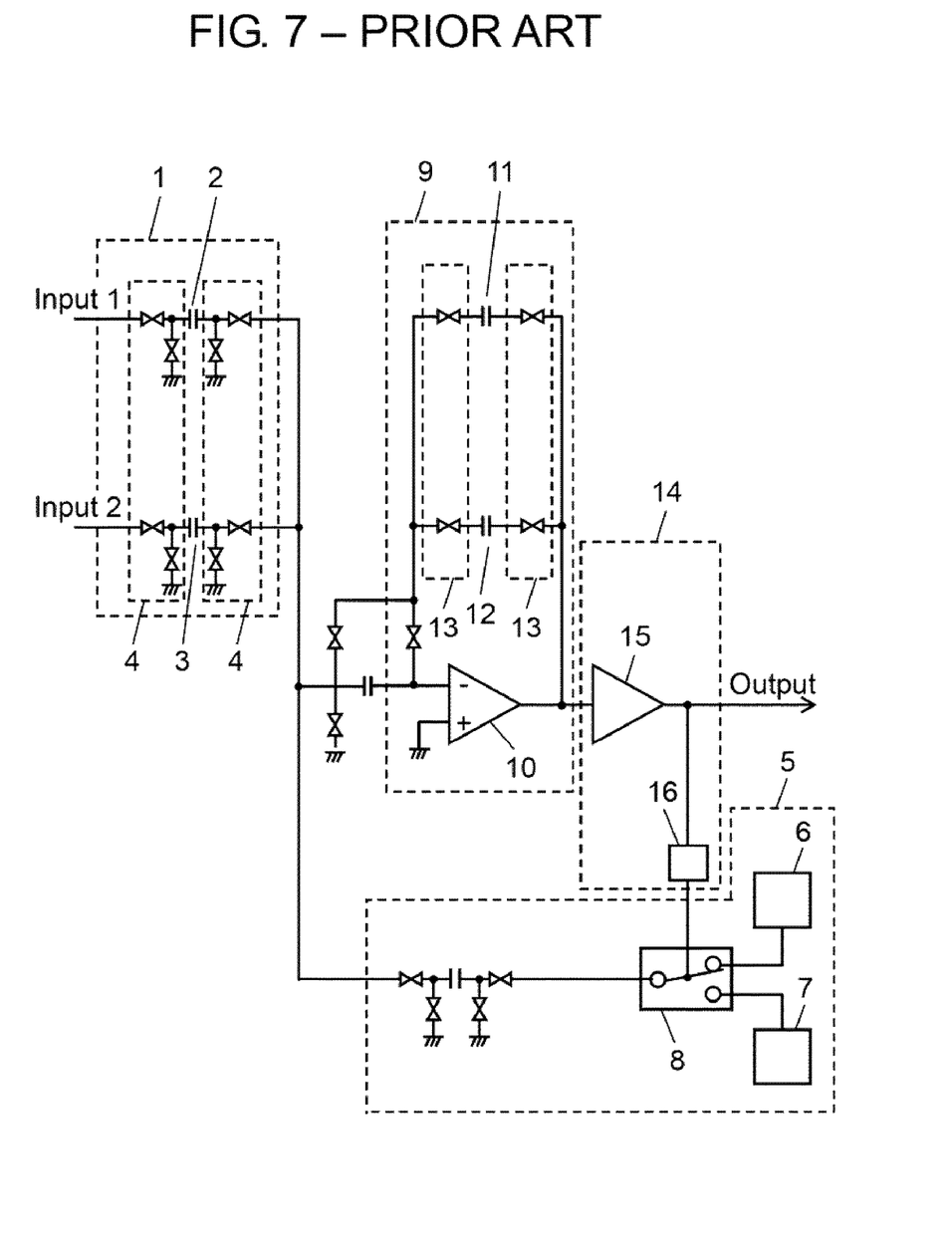
FIG. 7 is a circuit diagram of a conventional Σ-Δ type A/D converter.

FIG. 7 is a circuit diagram of the conventional Σ-Δ type A/D converter. In FIG. 7, input unit 1 comprises capacitor 2 connected to a first input, capacitor 3 connected to a second input and input switching devices 4 for switching these capacitors 2 and 3. Digital-to-analog ("D/A") converter unit 5 includes reference voltages 6 and 7 and D/A switching device 8 for switching a level of electric charge being output by selectively switching these reference voltages 6 and 7. Integrator unit 9 comprises operational amplifier 10 for receiving electric charges output from input unit 1 and D/A converter unit 5, capacitors 11 and 12 for storing the electric charges input thereto and integrator switching devices 13 for switching these capacitors 11 and 12.

Comparator unit 14 comprises comparator 15 for comparing a voltage output from integrator unit 9 with a predetermined voltage, and delay flip-flop 16 for holding a comparison signal output from comparator unit 15. An output of this delay flip-flop 16 is input to D/A switching device 8 for switching an output level of D/A converter unit 5.

The conventional Σ-Δ type A/D converter constructed as above operates in a manner, which is described hereinafter.

When the first input is selected, input unit 1 and integrator unit 9 charge and discharge capacitor 2 with electric charge of an amount proportional to the first input. The charged and discharged electric charge is then forwarded to capacitor 11. When the second input is selected, input unit 1 and integrator unit 9 charge and discharge capacitor 3 with electric charge of an amount proportional to the second input, and the charged and discharged electric charge is forwarded to capacitor 12 in the same manner.

As described, the conventional Σ-Δ type A/D converter operates in a manner to switch integration capacitors 11 and 12 according to the selection of the input signal. This Σ-Δ type A/D converter can hence shorten a delay in time of switching the input and reduce a size of the circuit as compared with other methods requiring A/D converters of the same number as that of input signals. Patent reference 1, for instance, is one of the prior art documents known to be relevant to the invention of this patent application.

In the conventional configuration discussed above, however, the reference voltage input to operational amplifier 10 in integrator unit 9 and reference voltages 6 and 7 in D/A converter unit 5 fluctuate as they are influenced by changes in the voltage of power supply as well as the temperature. Since they exert influences directly on signals output from the conventional Σ-Δ type A/D converter, they deteriorate accuracy of the outputs of the A/D converter.

[Patent Reference 1] Japanese Patent Unexamined Publication, No. 2001-237706.

SUMMARY OF THE INVENTION

The present invention provides a Σ-Δ type A/D converter featuring a steady output characteristic by way of avoiding fluctuations of output signals from a D/A converter unit and an integrator circuit due to changes in voltage of power supply and temperature, and the invention also provides an angular velocity sensor using the same.

The Σ-Δ type A/D converter according to the present invention comprises an input switching device for switching between at least two input signals, a D/A converter unit for outputting at least two levels of electric charge, an integrator unit for integrating electric charges output from the input switching device and the D/A converter unit and holding at least two integrated values, a comparator unit for comparing these at least two integrated values output from the integrator unit with a predetermined value, a D/A switching device for switching an output of the D/A converter unit according to at least two outputs of the comparator unit, and an arithmetic operation unit for performing computation on output signal of the comparator unit. The arithmetic operation unit includes a differential operation unit for computing a difference of at least the two comparison signals output from the comparator unit.

According to the configuration discussed above, output signals from the input switching device, the D/A converter unit, the integrator unit, the comparator unit and the D/A switching device are added simultaneously to at least the two signals input to the arithmetic operation unit. The differential operation unit provided in the arithmetic operation unit then computes a difference of processed results of these at least two input signals so as to cancel out the influence of fluctuations in reference voltages exerted on the output signals from the input switching device, the D/A converter unit, the integrator unit, the comparator unit and the D/A switching device.

REFERENCE MARKS IN THE DRAWINGS

30 Sensor element
32 Driver electrode
33 Monitor electrode
34 and 35 Sensor electrode
40 and 131 Driver circuit
41 PLL circuit
43 Timing control circuit
44, 81, 101 and 132 Input switching device
47, 84, 104 and 136 D/A switching device
48, 85, 105 and 133 D/A converter unit
62, 99, 119 and 134 Integrator unit
63 and 135 Comparator unit
70 Differential operation unit
71 Corrective operation unit
73 Arithmetic operation unit

DETAILED DESCRIPTION OF PREFERRED EMBODIMENTS

First Exemplary Embodiment

Description is provided hereinafter of a $\Sigma$–$\Delta$ type A/D converter and an angular velocity sensor using the same according to the first exemplary embodiment of the present invention with reference to the accompanying drawings.

Figure 1:
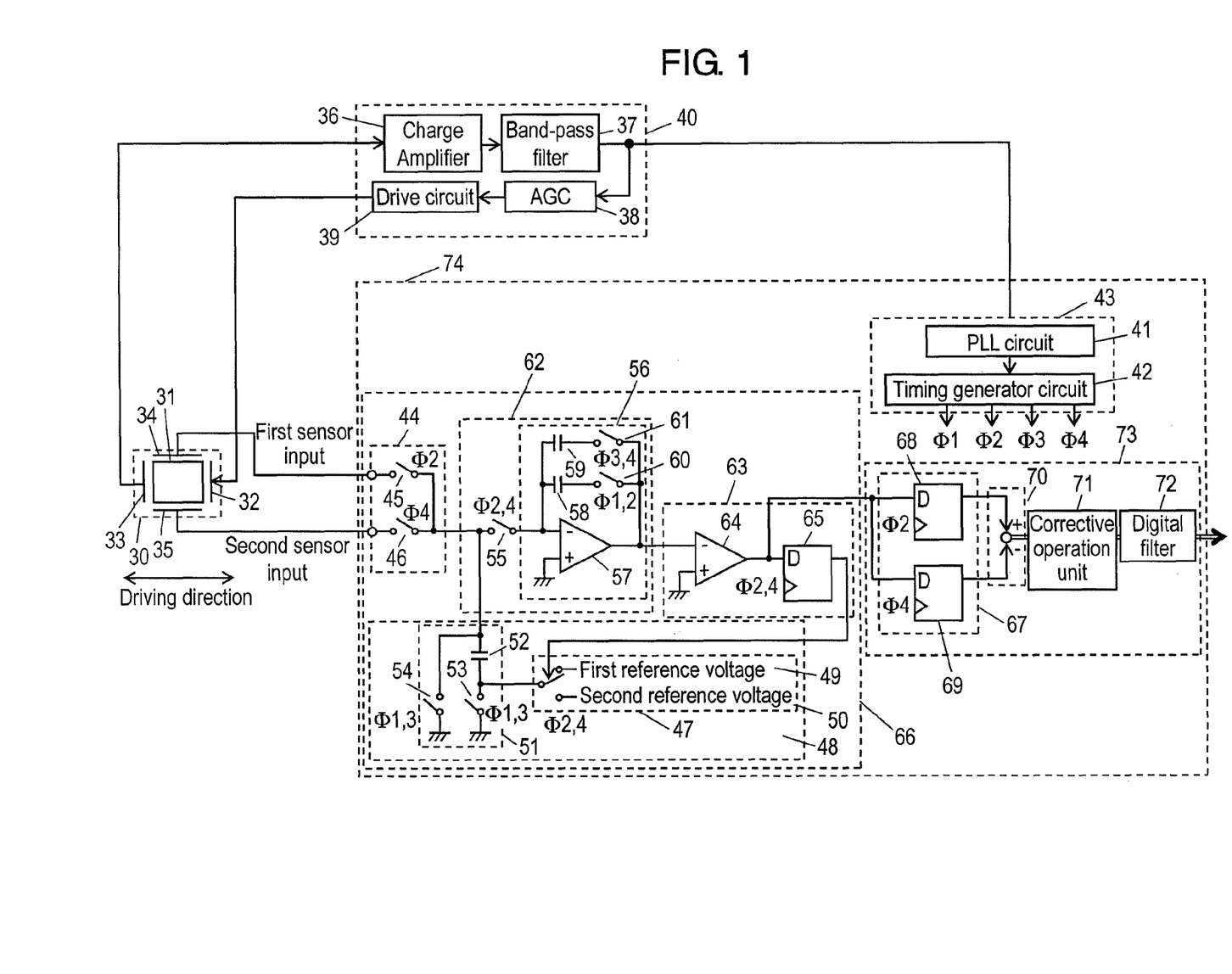
FIG. 1 is a circuit diagram of an angular velocity sensor using a Σ-Δ type A/D converter according to a first exemplary embodiment of the present invention.

FIG. 1 is a circuit diagram of the angular velocity sensor using the $\Sigma$–$\Delta$ type A/D converter according to the first exemplary embodiment of the present invention. Sensor element 30 in FIG. 1 comprises vibrator element 31, driver electrode 32 having a piezoelectric element for vibrating vibrator element 31, monitor electrode 33 having a piezoelectric element for generating an electric charge responsive to a vibrating condition, and a pair of sensor electrodes also having piezoelectric elements for generating electric charges when sensor element 30 is subjected to an angular velocity. The pair of sensor electrodes provided in sensor element 30 comprise first sensor electrode 34 and second sensor electrode 35 for generating electric charges of opposite polarities. The electric charge output from monitor electrode 33 of sensor element 30 is input to charge amplifier 36. This input electric charge is converted into a voltage with a predetermined multiplication factor. An output of charge amplifier 36 is input to band-pass filter 37, which removes a noise component from the input signal and outputs a monitor signal. Automatic gain control ("AGC") circuit 38 has a half-wave rectification and smoothing circuit (not shown) for half-wave rectifying and smoothing the output signal of band-pass filter 37 to produce a DC signal. The monitor signal output from band-pass filter 37 is then output after being amplified or attenuated according to this DC signal. This output of AGC circuit 38 is input to drive circuit 39, which in turn outputs a driving signal to driver electrode 32 of sensor element 30. Accordingly, charge amplifier 36, band-pass filter 37, AGC circuit 38 and drive circuit 39 constitute driver circuit 40.

Phase-lock loop ("PLL") circuit 41 multiplies the monitor signal output from band-pass filter 37 in driver circuit 40, and outputs it after reducing a phase noise by integrating it with time. Based on the multiplied monitor signal output from PLL circuit 41, timing generator circuit 42 produces four timing signals by dividing the monitor signal of two cyclic periods into first timing signal $\Phi$1, second timing signal $\Phi$2, third timing signal $\Phi$3 and fourth timing signal $\Phi$4, and outputs these signals. Details will be described later. PLL circuit 41 and timing generator circuit 42 constitute timing control circuit 43.

Input switching device 44 comprises analog switch 45 connected with first sensor electrode 34 of sensor element 30 and operating in response to the second timing signal $\Phi$2, and analog switch 46 connected with second sensor electrode 35 and operating in response to the fourth timing signal $\Phi$4. Input switching device 44 of this configuration outputs any of the input signals from first sensor electrode 34 and second sensor electrode 35 by switching them according to one of the second timing signal $\Phi$2 and the fourth timing signal $\Phi$4.

D/A switching device 47 has first reference voltage 49 and second reference voltage 50. First reference voltage 49 and second reference voltage 50 are switched according to a given signal so that a signal of first reference voltage 49 is output in response to the second timing signal $\Phi$2, whereas a signal of second reference voltage 50 is output in response to the fourth timing signal $\Phi$4. D/A output unit 51 comprises capacitor 52 for receiving the signal output from D/A switching device 47 and analog switches 53 and 54 connected to each end of capacitor 52 for discharging an electric charge in capacitor 52 by operating in response to the first timing signal $\Phi$1 and the third timing signal $\Phi$3. D/A switching device 47 and D/A output unit 51 thus constitute D/A converter unit 48. This D/A converter unit 48 discharges the electric charge in capacitor 52 in response to the first timing signal $\Phi$1 and the third timing signal $\Phi$3, and it also inputs and outputs an electric charge of a value corresponding to the reference voltage output by D/A switching device 47 according to the second timing signal $\Phi$2 and the fourth timing signal $\Phi$4.

Analog switch 55 receives the outputs of input switching device 44 and D/A converter unit 48, and outputs them according to the second timing signal $\Phi$2 and the fourth timing signal $\Phi$4. Integrator circuit 56 receives the output of analog switch 55. Integrator circuit 56 comprises operational amplifier 57, a pair of capacitors 58 and 59 connected in parallel to each other in a feedback path of this operational amplifier 57 and a pair of analog switches 60 and 61 connected to capacitors 58 and 59 respectively. Analog switch 60 operates in response to the first timing signal $\Phi$1 and the second timing signal $\Phi$2 to integrate the signal input to integrator circuit 56 and holds the integrated value in capacitor 58. Analog switch 61 operates in response to the third timing signal $\Phi$3 and the fourth timing signal $\Phi$4 to integrate the signal input to integrator circuit 56 and holds the integrated value in capacitor 59. Integrator unit 62 comprises analog switch 55 and integrator circuit 56. Integrator unit 62 integrates the output of analog switch 55 into capacitor 58 and outputs the integrated value in response to the first timing signal $\Phi$1 and the second timing $\Phi$2 signal, and also integrates the output of analog switch 55 into capacitor 59 and outputs the integrated value in response to the third timing signal $\Phi$3 and the fourth timing signal $\Phi$4.

The integrated signal output from integrator unit 62 is input to comparator unit 63. Comparator unit 63 comprises comparator 64 for comparing the integrated signal with a predetermined value, and D-type flip-flop 65 receiving a one-bit digital signal output from comparator 64. D-type flip-flop 65 latches the aforesaid one-bit digital signal and outputs a latch signal at the rising periods of the second timing signal $\Phi$2 and the fourth timing signal $\Phi$4. This latch signal is input to D/A switching device 47 of D/A converter unit 48, and it switches between first reference voltage 49 and second reference voltage 50. Here, $\Sigma$–$\Delta$ modulator 66 comprises input switching device 44, D/A converter unit 48, integrator unit 62 and comparator unit 63.

$\Sigma$–$\Delta$ modulator 66 of the above configuration carries out $\Sigma$–$\Delta$ modulation of the electric charges output from the pair of sensor electrodes 34 and 35 of sensor element 30, and outputs after converting them into a one-bit digital signal.

The one-bit digital signal output from comparator 64 in comparator unit 63 of Σ-Δ modulator 66 is input to latching circuit 67. Latching circuit 67 comprises a pair of D-type flip-flops 68 and 69 for latching the one-bit digital signal. D-type flip-flop 68 latches the one-bit digital signal in response to the second timing signal Φ2, and D-type flip-flop 69 latches the one-bit digital signal in response to the fourth timing signal Φ4. A pair of the one-bit digital signals latched and output by the pair of D-type flip-flops 68 and 69 in latching circuit 67 is input to differential operation unit 70, wherein one-bit differential operation is carried out by the substitution method to compute a difference between this pair of one-bit digital signals. In other words, when the pair of one-bit digital signals input to differential operation unit 70 are any of "0, 0", "0, 1", "1, 0" and "1, 1", they are substituted by "0", "−1", "1" and "0" respectively before being output. The one-bit differential signal output from differential operation unit 70 is input to corrective operation unit 71, which in turn carries out a corrective operation by substituting this one-bit differential signal with a predetermined correction data. In other words, the one-bit differential signal input to corrective operation unit 71 is any of "0", "1" and "−1" as discussed above, and they are output after substituted with "0", "5" and "−5" respectively when the correction data is "5" for instance. The digital differential signal output from corrective operation unit 71 is input to digital filter 72, which then carries out a filtering process to remove a noise component. Arithmetic operation unit 73 comprises latching circuit 67, differential operation unit 70, corrective operation unit 71 and digital filter 72. This arithmetic operation unit 73 latches the pair of one-bit digital signal according to the second timing signal Φ2 and the fourth timing signal Φ4, carries out the differential operation, the corrective operation and the filtering process, and outputs a multi-bit signal. Sensor circuit 74 thus comprises timing control circuit 43, Σ-Δ modulator 66 and arithmetic operation unit 73.

The angular velocity sensor according to the first exemplary embodiment of the present invention constructed as above operates in a manner, which is described hereinafter.

When an alternating voltage is applied to driver electrode 32 of sensor element 30, vibrator element 31 resonates and generates an electric charge in monitor electrode 33. The electric charge generated in monitor electrode 33 is input to charge amplifier 36 in driver circuit 40, which converts it into an output voltage of sinusoidal wave.

Figure 2:
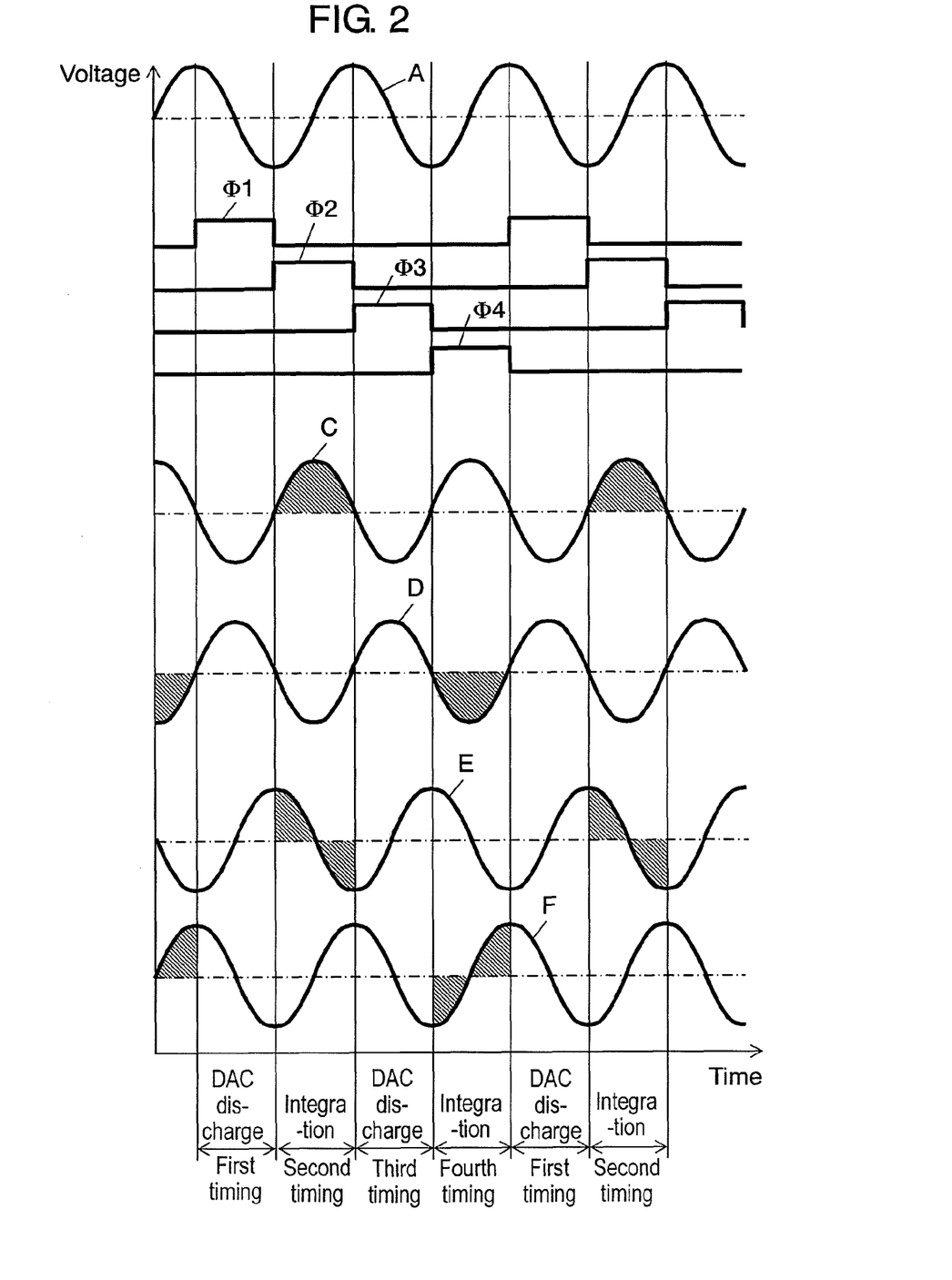
FIG. 2 is a graphical representation showing operating modes of the angular velocity sensor using the Σ-Δ type A/D converter according to the first exemplary embodiment of the present invention.

FIG. 2 is a graphical representation showing operating modes of the angular velocity sensor using the Σ-Δ type A/D converter according to the first exemplary embodiment of the present invention. In FIG. 2, the output voltage of charge amplifier 36 is input to band-pass filter 37, which in turn extracts only a resonant frequency of vibrator element 31 and outputs sinusoidal wave signal A with the noise component removed. This sinusoidal wave signal A is input to a half-wave rectification and smoothing circuit (not shown) provided in AGC circuit 38 and converted into a DC signal.

When this DC signal is too large in amplitude, AGC circuit 38 sends a signal to drive circuit 39 to attenuate the output signal of band-pass filter 37 in driver circuit 40. If the DC signal is too small in amplitude, on the other hand, AGC circuit 38 sends another signal to drive circuit 39 to amplify the output signal of band-pass filter 37 in driver circuit 40. Accordingly, vibrator element 31 can be controlled in a manner to maintain a constant amplitude of vibration by virtue of the above operation.

The sinusoidal wave signal A shown in FIG. 2 is input to timing control circuit 43 in sensor circuit 74. Timing generator circuit 42 generates the first timing signal Φ1, second timing signal Φ2, third timing signal Φ3 and fourth timing signal Φ4 shown in FIG. 2 based on the signal multiplied by PLL circuit 41. These timing signals Φ1, Φ2, Φ3 and Φ4 are input to Σ-Δ modulator 66 and arithmetic operation unit 73 as switch signals for analog switches 45, 46, 53, 54, 55, 60 and 61 and a latch-timing signal for latching circuit 67.

It is also possible to generate timing signals Φ1, Φ2, Φ3 and Φ4 by an alternative method of shifting the sinusoidal wave signal by 90 degrees with a phase shifter, inputting the shifted signal to a voltage comparator (not shown) for comparing it with a predetermined reference voltage (not shown) and feeding an output of it into a logic circuit (not shown). In the case of this method, however, there arises a phase noise due to a voltage noise of the sinusoidal wave signal and a voltage noise attributed to changes in temperature and fluctuations in the power supply voltage. This phase noise becomes a primary factor of adversely affecting accuracy of the signal processing by playing a role of switching the input signals and the switching devices of the integrator as a timing noise. PLL circuit 41 is therefore used to generate the timing signal with the phase noise reduced by integrating it with time, thereby decreasing the switching timing noise and improving the accuracy of the signal processing.

When sensor element 30 is rotated on the center axis in the longitudinal direction of vibrator element 31 at angular velocity ω while being kept under a flexuous vibrating condition at velocity V in a drive direction shown in FIG. 1, a Coriolis force F of 2 mV×ω is generated in sensor element 30. This Coriolis force generates voltages C and D shown in FIG. 2 in the pair of sensor electrodes 34 and 35 provided in sensor element 30. Since these voltages in sensor electrodes 34 and 35 are generated by the Coriolis force, they have 90 degrees of phase advance to the signal generated in monitor electrode 33. Moreover, the output signals generated in the pair of sensor electrodes 34 and 35 are in the relation of positive polarity and negative polarity, as shown by waveforms C and D in FIG. 2.

In this case, Σ-Δ modulator 66 operates in a manner as described hereafter. Σ-Δ modulator 66 operates by repeating processes corresponding to the first timing signal Φ1, the second timing signal Φ2, the third timing signal Φ3 and the fourth timing signal Φ4. In the first timing signal Φ1 and the second timing signal Φ2, a positive signal output from sensor electrode 34 of sensor element 30 is subjected to Σ-Δ modulation and converted into a one-bit digital signal, and in the third timing signal Φ3 and the fourth timing signal Φ4 a negative signal is subjected to Σ-Δ modulation and converted into another one-bit digital signal.

The above processes corresponding to the four timing signals are now described individually. At the rising period of the first timing signal Φ1, analog switch 60 connected with capacitor 58 inside integrator unit 62 turns on and delivers the integrated value held in capacitor 58 to comparator 64 in comparator unit 63, which outputs a compared result as a one-bit digital signal. At the same time, analog switches 53 and 54 in D/A converter unit 48 turn on to discharge the electric charge held in capacitor 52.

Next, at the rising period of the second timing signal Φ2, the one-bit digital signal output from comparator 64 in comparator unit 63 is latched in D-type flip-flop 65 and this latch signal is input to D/A switching device 47 in D/A converter unit 48. D/A switching device 47 selectively switches one of reference voltages 49 and 50 according to this input latch signal and feed it to capacitor 52, so as to make D/A converter unit 48 output an electric charge corresponding to the selected reference voltage. On the other hand, analog switch 45 turns on inside input switching device 44 and outputs an electric charge generated in sensor electrode 34 of sensor element 30. At the same time, analog switch 55 in integrator unit 62 turns on and delivers to integrator circuit 56 the electric charges output from input switching device 44 and D/A converter unit 48. This makes capacitor 58 in integrator circuit 56 hold an integrated sum of an electric charge shown by a shaded portion of the waveform C in FIG. 2 and the electric charge output from D/A converter unit 48 during the second timing signal $\Phi 2$.

According to the above operation by the first timing signal $\Phi 1$ and the second timing signal $\Phi 2$, the electric charge of a value equivalent to half an amplitude of the voltage output from sensor electrode 34 of sensor element 30 is $\Sigma$-$\Delta$ modulated and output as a one-bit digital signal at the rising periods of the first timing signal $\Phi 1$ and the second timing signal $\Phi 2$.

In the like manner, the electric charge of a value equivalent to half an amplitude of the voltage output from sensor electrode 35 of sensor element 30 is $\Sigma$-$\Delta$ modulated and output after converted into one-bit digital signal at the rising periods of the third timing signal $\Phi 3$ and the fourth timing signal $\Phi 4$.

As mentioned, the above operation allows $\Sigma$-$\Delta$ modulator 66 to carry out $\Sigma$-$\Delta$ modulation of the electric charges of the value equivalent to half an amplitude of the voltages output from the pair of sensor electrodes 34 and 35 of sensor element 30 and output them as one pair of one-bit digital signals at the timings discussed above.

The electric charges output from the pair of sensor electrodes 34 and 35 of sensor element 30 include not only the sensor signals having their phases advanced by 90 degrees to the signal generated in monitor electrode 33 but also undesired signals generated in the same phase as that of the monitor signal. Described here is the case wherein the pair of sensor electrodes 34 and 35 of sensor element 30 output composite signals including the sensor signals and undesired signals.

The sensor signals generated by the Coriolis force born by the angular velocity are shown as the waveforms C and D in FIG. 2. As described above, integrator circuit 56 integrates the electric charges shown by the shaded portions of the waveforms C and D in FIG. 2, or the charges equivalent to half the amplitude of the voltages, in response to the second timing signal $\Phi 2$ and the fourth timing signal $\Phi 4$. The undesired signals generated in sensor electrodes 34 and 35 are shown by waveforms E and F in FIG. 2. In the like manner as the sensor signals C and D, integrator circuit 56 also integrates electric charges shown by the shaded portions of the undesired signals E and F, or the charges within the period between the highest value to the lowest value in voltage amplitude of the undesired signals, by the second timing signal $\Phi 2$ and the fourth timing signal $\Phi 4$. Since the electric charges are integrated with reference to the median value in amplitude of the voltages E and F, they are canceled out to become "zero". In other words, the operation of integrator unit 62 cancels the undesired signals shown by E and F at the rising periods of the second timing signal $\Phi 2$ and the fourth timing signal $\Phi 4$. Integrator circuit 56 thus integrates the amounts of electric charges corresponding to the voltage amplitudes of sensor signals C and D, and carriers out the process of so-called synchronous detection on each of the pair of input signals C and D. Accordingly, $\Sigma$-$\Delta$ modulator 66 carries out $\Sigma$-$\Delta$ modulation of the synchronous-detected signals, converts them into one-bit digital signals and outputs them in the same manner as in the above case of the signals not bearing the undesired signals E and F.

The above operation can achieve the $\Sigma$-$\Delta$ modulation while performing the synchronous detection on the pair of output signals from sensor element 30. It thus becomes possible to obtain the synchronous-detected digital signals without requiring any analog circuit such as a common IV converter circuit, phase shifter and synchronous detector. As a result, there realizes the $\Sigma$-$\Delta$ type A/D converter of small size at low cost.

Described next pertains to arithmetic operation unit 73 and its operation. First, the one-bit digital signal output from comparator 64 in comparator unit 63 of $\Sigma$-$\Delta$ modulator 66 is latched in D-type flip-flop 68 of latching circuit 67 in response to the second timing signal $\Phi 2$. The other one-bit digital signal also output from comparator 64 in comparator unit 63 of $\Sigma$-$\Delta$ modulator 66 is latched in D-type flip-flop 69 of latching circuit 67 in response to the fourth timing signal $\Phi 4$.

As discussed above, the pair of one-bit digital signals latched in this pair of D-type flip-flops 68 and 69 are the signals of digital values converted by subjecting the electric charges of values equivalent to half the voltage amplitudes of the signals output from the pair of sensor electrodes 34 and 35 of sensor element 30 to $\Sigma$-$\Delta$ modulation respectively after the undesired signals removed from them.

Next, a pair of one-bit digital signals output from latching circuit 67 are input to one-bit differential operation unit 70, wherein a difference of this pair of one-bit digital signals is computed and a one-bit differential signal is output. The one-bit differential signal generated here at the first timing signal $\Phi 1$ represents a difference of the one-bit digital signals latched in response to the second timing signal $\Phi 2$ and the fourth timing signal $\Phi 4$ in the preceding period. This one-bit differential signal signifies a value of the voltage amplitude obtained after the undesired signals shown by E and F in FIG. 2 are removed from the signals C and D output from the pair of sensor electrodes 34 and 35 of sensor element 30.

The above operation achieves the integration of the pair of input signals having a relation of positive polarity and negative polarity output from the pair sensor electrodes 34 and 35 of sensor element 30 by using only the same single integrator unit 62. This helps reduce substantially an adverse influence to a relative error in the integration result of the pair of input signals attributed to characteristics of individual integrators should two integrators be needed to carry out the integration separately. Likewise, this configuration requires only one D/A converter unit 48 to process the pair of input signals. The same is also true with comparator unit 63 that the comparison of the pair of integration results can be made by using the same reference voltage and the comparator so as to reduce substantially the influence of characteristics of the comparator and fluctuations of the reference voltage upon a relative error in the comparison result.

Furthermore, the pair of input signals also receive an influence of fluctuations of the reference voltage due to fluctuations in the power supply voltage and changes in the temperature. However, such influences caused by the fluctuations of the reference voltage and the like in the individual units can be canceled out since the difference in the result of processing the pair of input signals is computed by one-bit differential operation unit 70 provided in arithmetic operation unit 73. Other influences that can also be canceled are those attributed to in-phase noise components and offset components contained in the pair of input signals output from the pair of sensor electrodes 34 and 35 of sensor element 30 and input to the $\Sigma$-$\Delta$ type A/D converter. It hence becomes possible to form the differential signal accurately from the pair of input signal.

In this one-bit differential operation for obtaining a difference of the pair of input signals, it is known that the pair of signals input to and compared in the differential operation unit is limited only to one of four combinations, "0, 0", "0, 1", "1, 0" and "1, 1", when the output signal of the comparator is a one-bit signal of "0" or "1". It is therefore possible to carry out the process of subtraction according to the input signal with a very simple circuit configuration since a result of the subtraction is known beforehand as to be one of "0", "−1", "1" and "0". By way of carrying out the signal processing such as low-pass filtering and decimation with a digital filter normally needed for the Σ-Δ type A/D conversion on a single differential signal obtained after subjecting the pair of input signals to the subtraction process, there is achieved a highly accurate signal processing with the arithmetic operation unit such as a differential operation circuit and a digital filter of significantly small-scale as compared with the conventional case provided with a digital filter for each of the pair of input signals to perform the signal processing such as low-pass filtering and decimation of the signals for obtaining multi-bit signals and an arithmetic operation unit capable of adding and subtracting the multi-bit signals for carrying out the differential operation process.

Next, the one-bit differential signal output from differential operation unit 70 is input to corrective operation unit 71, wherein the corrective operation is carried out by substituting this one-bit differential signal with a predetermined correction data. This corrective operation makes use of the advantage that the one-bit differential signal is limited to one of the three values, "0", "1" and "−1" as discussed above. When a correction data of "5" is used, for instance, the one-bit differential signals input to the corrective operation unit are substituted with "0", "5" and "−5" respectively to achieve multiplication and the correction of the signals It thus becomes possible by setting the correction data of an appropriate value to make correction of variations in sensitivity of sensor element 30 to angular velocity due to unit-to-unit variations in the manufacturing and fluctuations in the sensitivity of sensor element 30 attributed to changes of the temperature. The above operation can be achieved with a circuit of a significantly small-scale as compared with a conventional configuration for converting the input signals into multi-bit signals with a digital filter and making correction of the signals by using a multiplier for performing a multiplication process on the multi-bit signals.

In addition, the above substitution method can achieve a highly accurate corrective operation since there is no process of round-down to meet a finite word length. Accordingly, what can be achieved here is a high accurate setting of sensitivities of both sensor element 30 and sense circuit 74 with small size and low cost.

Second Exemplary Embodiment

Description is provided hereinafter of an angular velocity sensor using a Σ-Δ type A/D converter according to the second exemplary embodiment of the present invention with reference to the accompanying drawings. Like reference marks are used to designate like structural components as those of the previously described first exemplary embodiment of this invention and their details will therefore be omitted.

Figure 3:
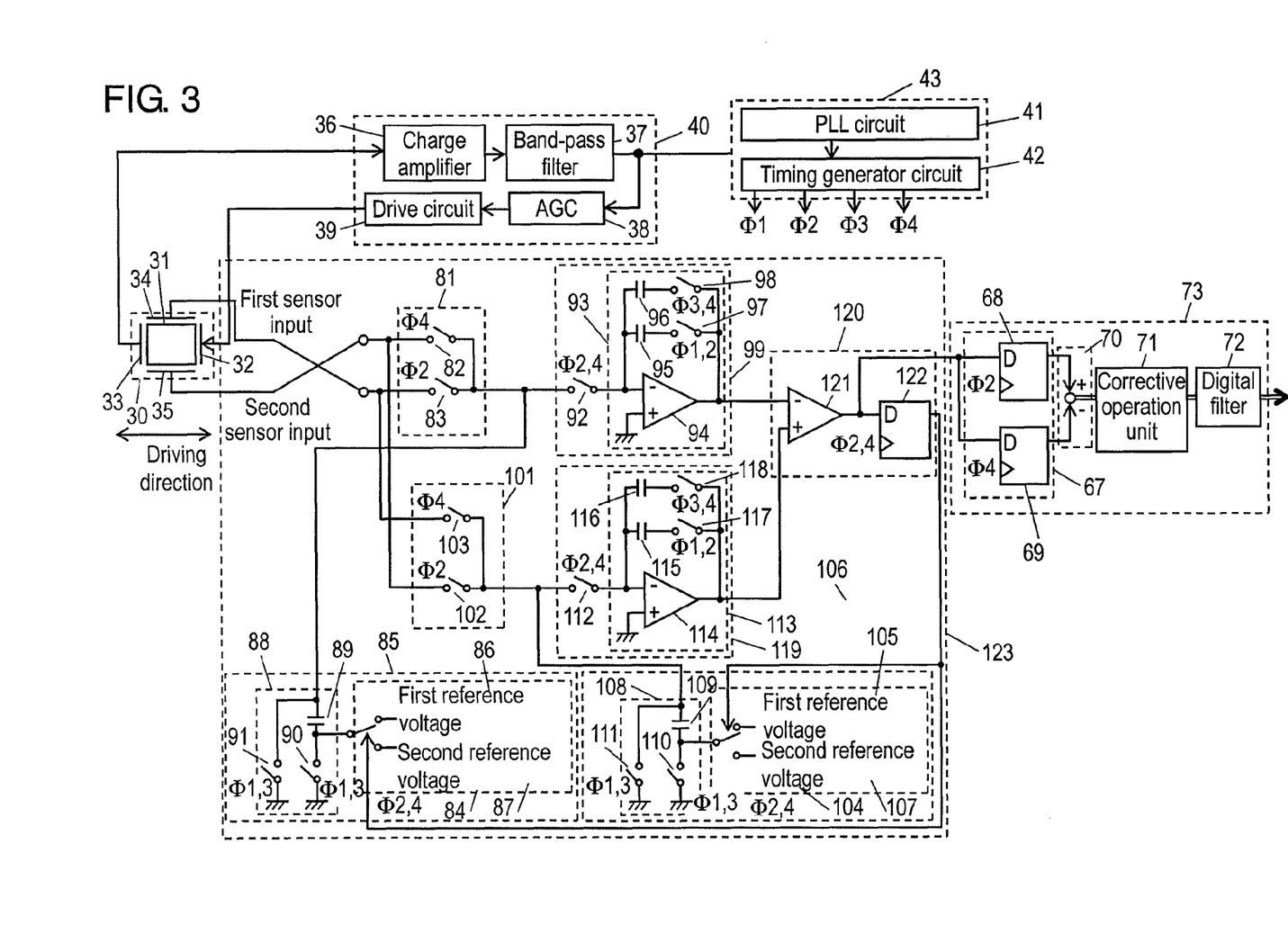
FIG. 3 is a circuit diagram of an angular velocity sensor using a Σ-Δ type A/D converter according to a second exemplary embodiment of the present invention.

FIG. 3 is a circuit diagram of the angular velocity sensor using the Σ-Δ type A/D converter according to the second exemplary embodiment of this invention. Input switching device 81 in FIG. 3 comprises analog switches 82 and 83. Analog switch 83 is connected with first sensor electrode 34 of sensor element 30, and it operates in response to second timing signal Φ2. Analog switch 82 is connected with second sensor electrode 35, and it operates in response to fourth timing signal Φ4. Input switching device 81 selectively switches the input signals from the pair of sensor electrodes 34 and 35 and outputs it in response to the second timing signal Φ2 and the fourth timing signal Φ4.

D/A switching device 84 has first reference voltage 86 and second reference voltage 87. D/A switching device 84 selectively switches first reference voltage 86 and second reference voltage 87 in response to a predetermined signal, and output it according to the second timing signal Φ2 and the fourth timing signal Φ4. DA output unit 88 comprises capacitor 89 and analog switches 90 and 91. Capacitor 89 receives an output signal of D/A switching device 84. Analog switches 90 and 91 are connected to each end of capacitor 89, and discharge an electric charge in this capacitor 89 by operating in response to the first timing signal Φ1 and the third timing signal Φ3. D/A switching device 84 and DA output unit 88 thus constitute D/A converter unit 85. This D/A converter unit 85 discharges the electric charge in capacitor 89 in response to the first timing signal Φ1 and the third timing signal Φ3, and inputs and outputs the electric charge of a value corresponding to a reference voltage output by D/A switching device 84 according to the second timing signal Φ2 and the fourth timing signal Φ4.

Analog switch 92 receives the outputs of input switching device 81 and D/A converter unit 85, and outputs them according to the second timing signal Φ2 and the fourth timing signal Φ4. Integrator circuit 93 receives the output of analog switch 92. Integrator circuit 93 comprises operational amplifier 94, a pair of capacitors 95 and 96 connected in parallel to each other in a feedback path of this operational amplifier 94 and a pair of analog switches 97 and 98 connected to these capacitors 95 and 96 respectively. Analog switch 97 operates in response to the first timing signal Φ1 and the second timing signal Φ2 to integrate the signal input to integrator circuit 93 and holds the integrated value in capacitor 95. Analogue switch 98 operates in response to the third timing signal Φ3 and the fourth timing signal Φ4 to integrate the signal input to integrator circuit 93 and holds the integrated value in capacitor 96. Integrator unit 99 comprises analog switch 92 and integrator circuit 93. This integrator unit 99 integrates the output of analog switch 92 in capacitor 95 and outputs the integrated value in response to the first timing signal Φ1 and the second timing Φ2 signal, and also integrates the output of analog switch 92 in capacitor 96 and outputs the integrated value in response to the third timing signal Φ3 and the fourth timing signal Φ4.

Input switching device 101 comprises analog switches 102 and 103. Analog switch 103 is connected with first sensor electrode 34 of sensor element 30 and operates in response to the fourth timing signal Φ4. Analog switch 102 is connected with second sensor electrode 35 and operates in response to the second timing signal Φ2. Input switching device 101 outputs any of the input signals from the pair of sensor electrodes 34 and 35 by switching them according to the fourth timing signal Φ4 and the second timing signal Φ2.

D/A switching device 104 has first reference voltage 106 and second reference voltage 107, and it selectively switches them according to a given signal and outputs any of first reference voltage 106 and second reference voltage 107 in response to the second timing signal Φ2 and the fourth timing signal Φ4. D/A output unit 108 comprises capacitor 109 and analog switches 110 and 111. Capacitor 109 receives the output signal of D/A switching device 104. Analog switches 110 and 111 are connected to each end of capacitor 109 and discharge an electric charge in capacitor 109 in response to the first timing signal Φ1 and the third timing signal Φ3. D/A switching device 104 and D/A output unit 108 thus constitute D/A converter unit 105. This D/A converter unit 105 discharges the electric charge in capacitor 109 in response to the first timing signal Φ1 and the third timing signal Φ3. It also inputs and outputs an electric charge of a value corresponding to the reference voltage output by D/A switching device 104 in response to the second timing signal Φ2 and the fourth timing signal Φ4.

Analog switch 112 receives the outputs of input switching device 101 and D/A converter unit 105, and outputs them according to the second timing signal Φ2 and the fourth timing signal Φ4. Integrator circuit 113 receives the output of analog switch 112. Integrator circuit 113 comprises operational amplifier 114, a pair of capacitors 115 and 116 connected in parallel to each other in a feedback path of this operational amplifier 114 and a pair of analog switches 117 and 118 connected to these capacitors 115 and 116 respectively. Analog switch 117 operates in response to the first timing signal Φ1 and the second timing signal Φ2 to integrate the signal input to integrator circuit 113 and holds the integrated value in capacitor 115. Analogue switch 118 operates in response to the third timing signal Φ3 and the fourth timing signal Φ4 to integrate the signal input to integrator circuit 113 and holds the integrated value in capacitor 116. Integrator unit 119 comprises analog switch 112 and integrator circuit 113. Integrator unit 119 integrates the output of analog switch 112 in capacitor 115 and outputs the integrated value in response to the first timing signal Φ1 and the second timing Φ2 signal. It also integrates the output of analog switch 112 in capacitor 116 and outputs the integrated value in response to the third timing signal Φ3 and the fourth timing signal Φ4.

The integrated signals output from integrator units 99 and 119 are input to comparator unit 120. Comparator unit 120 comprises comparator 121 for comparing these integrated signals with a predetermined value and D-type flip-flop 122 receiving a one-bit digital signal output from comparator 121. D-type flip-flop 122 latches the one-bit digital signal and outputs a latch signal at the rising periods of the second timing signal Φ2 and the fourth timing signal Φ4. This latch signal is input to D/A switching devices 84 and 104 of D/A converter units 84 and 104, and it switches between reference voltages 86 and 87 and also between reference voltages 106 and 107. Σ–Δ modulator 123 comprises input switching devices 81 and 102, D/A converter units 85 and 105, integrator units 99 and 119 and comparator unit 120.

This Σ–Δ modulator 123 carries out Σ–Δ modulation of the electric charges output from the pair of sensor electrodes 34 and 35 of sensor element 30, and outputs after converting them into a one-bit digital signal.

The angular velocity sensor according to the second exemplary embodiment of this invention constructed as above operates in a manner, which is described hereinafter. Described first pertains to the afore-said Σ–Δ modulator 123 and operation thereof.

Figure 4:
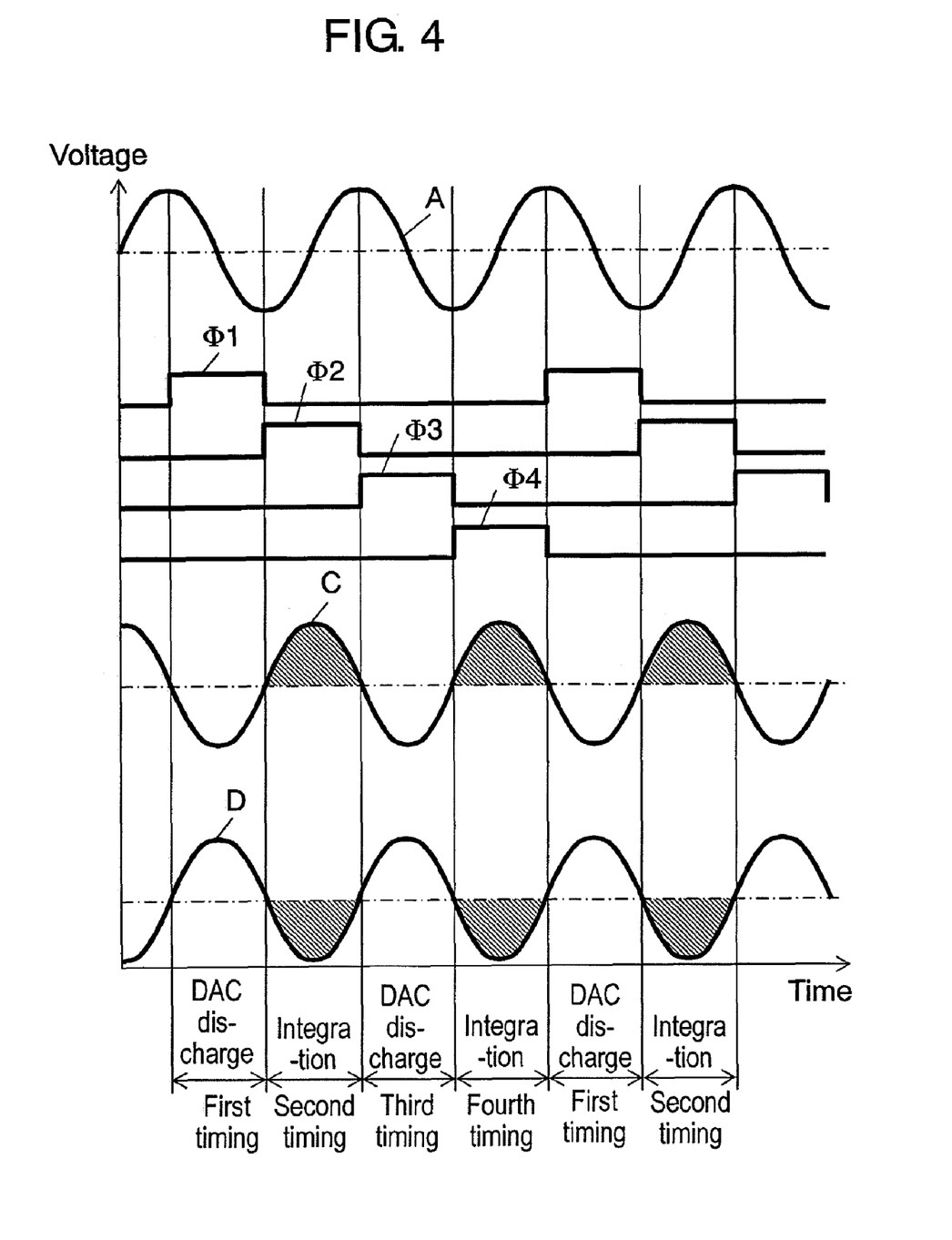
FIG. 4 is a graphical representation showing operating modes of the angular velocity sensor using the Σ-Δ type A/D converter according to the second exemplary embodiment of the present invention.

FIG. 4 is a graphical representation showing operating modes of the angular velocity sensor using the Σ–Δ type A/D converter according to the second exemplary embodiment of this invention. In FIG. 4, this ΣΔ modulator 123 operates by repeating processes corresponding to the first timing signal Φ1, the second timing signal Φ2, the third timing signal Φ3 and the fourth timing signal Φ4.

A positive signal output from sensor electrode 34 of sensor element 30 is integrated by first input switching device 81, first D/A converter unit 85 and first integrator unit 109 in response to the first timing signal Φ1 and the second timing signal Φ2. A negative signal output from sensor electrode 35 of sensor element 30 is also integrated by second input switching device 101, second D/A converter unit 105 and second integrator unit 119. A pair of integrated values output from first integrator unit 99 and second integrator unit 119 are input to and compared by comparator 121 in comparator unit 120 and a result of the comparison is output as a one-bit digital signal.

At the rising period of the second timing signal Φ2, the one-bit digital signal output from comparator 121 of comparator unit 120 is latched in D-type flip-flop 122 and this latch signal is input to D/A switching devices 84 and 104 in D/A converter units 85 and 105. A value of the one-bit digital signal Σ–Δ modulated and output here at the rising period of the second timing signal Φ2 is the value obtained by subtracting a voltage amplitude of the signal made out of the negative signal from a voltage amplitude of the signal made out of the positive signal. This value signifies a data of positive amplitude of the voltage output from the pair of sensor electrodes 34 and 35, and this value is latched in D-type flip-flop 68 of arithmetic operation unit 73.

The positive signal output from sensor electrode 34 of sensor element 30 is integrated by second input switching device 101, second D/A converter unit 105 and second integrator unit 119 in response to the third timing signal Φ3 and the fourth timing Φ4. At the same time, the negative signal output from sensor electrode 35 of sensor element 30 is integrated by first input switching device 81, first D/A converter unit 85 and first integrator unit 99. A pair of the integrated values output from first integrator unit 99 and second integrator unit 119 are then input to and compared by comparator 121 in comparator unit 120 and a result of the comparison is output as a one-bit digital signal.

At the rising period of the fourth timing signal Φ4, the one-bit digital signal output from comparator 121 of comparator unit 120 is latched in D-type flip-flop 122 and this latch signal is input to D/A switching devices 84 and 104 in the aforesaid D/A converter units 85 and 105. A value of the one-bit digital signal Σ–Δ modulated and output here at the rising period of the fourth timing signal Φ4 is the value obtained by subtracting the voltage amplitude of the signal made out of the positive signal from the voltage amplitude of the signal made out of the negative signal. This value signifies a data of negative amplitude of the voltage output from the pair of sensor electrodes 34 and 35, and this value is latched in D-type flip-flop 69 of arithmetic operation unit 73.

The above processes corresponding to the four timing signals are now described individually. At the rising period of the first timing signal Φ1, analog switch 97 connected with capacitor 95 inside integrator unit 99 turns on and delivers the integrated value held in capacitor 95 to comparator 121 in comparator unit 120. At the same time, analog switch 117 connected with capacitor 115 inside integrator unit 119 turns on and delivers the integrated value held in capacitor 115 to comparator 121 in comparator unit 120. A compared result of this pair of the integrated values is output a as a one-bit digital signal. Analog switches 90, 91, 110 and 111 inside D/A converter units 85 and 105 also turn on and the electric charges held in capacitors 89 and 109 are discharged.

Next, at the rising period of the second timing signal Φ2, the one-bit digital signal output from comparator 121 of comparator unit 120 is latched in D-type flip-flop 122 and this latch signal is input to D/A switching devices 84 and 104 in the D/A converter units 85 and 105. D/A converter units 85 and 105 then selectively switch between reference voltages 86 and 87 and between reference voltages 106 and 107 according to this input latch signal, and input the selected reference voltages to capacitors 89 and 109, so as to output electric charges corresponding to the selected reference voltages. In input switching device 81, analog switch 83 turns on at the same time, and outputs the electric charge produced in sensor electrode 34 of sensor element 30. On the other hand, analog switch 102 in input switching device 101 turns on, and outputs the electric charge produced in the sensor electrode 35 of sensor element 30. In addition, analog switches 92 and 112 in integrator units 109 and 119 turn on, so that the electric charges output from input switching device 81 and D/A converter unit 85 are delivered to integrator circuit 93, and the electric charges output from input switching device 101 and D/A converter unit 105 are delivered to integrator circuit 113. This makes capacitor 95 in integrator circuit 93 hold an integrated sum of the electric charge shown by a shaded portion of the waveform C in FIG. 4 and the electric charge output from D/A converter unit 85, and capacitor 115 in integrator circuit 113 hold an integrated sum of the electric charge shown by a shaded portion of the waveform D in FIG. 4 and the electric charge output from D/A converter unit 105 during the second timing signal Φ2.

According to the above operation by the first timing signal Φ1 and the second timing signal Φ2, electric charge of a value equivalent to a positive value in amplitude of the voltages output from sensor electrodes 34 and 35 of sensor element 30 is subjected to Σ-Δ modulation and output as a one-bit digital signal at the rising periods of the first timing signal Φ1 and the second timing signal Φ2.

Similarly, in the periods of the third timing signal Φ3 and the fourth timing signal Φ4, electric charge of a value equivalent to a negative value in amplitude of the voltages output from sensor electrodes 34 and 35 of sensor element 30 is subjected to Σ-Δ modulation and output after being converted into a one-bit digital signal at the rising periods of the third timing signal Φ3 and the fourth timing signal Φ4.

By way of the above operation, the electric charges of the values equivalent to both the positive and negative values in amplitude of the voltages output from the pair of sensor electrodes 34 and 35 of sensor element 30 are subjected to Σ-Δ modulation by Σ-Δ modulator 123 and output as a pair of the one-bit digital signals at the above timing. Since both the positive signal and the negative signal are integrated at the same time and their difference Σ-Δ modulated, the one-bit digital signals are output with in-phase transient noises eliminated. Moreover, the pair of one-bit digital signals output at the rising periods of the second timing signal Φ2 and the fourth timing signal Φ4 are influenced similarly by fluctuations of the reference voltages and variations of offset of the two integrator units 109 and 119 as well as D/A converter units 85 and 105 since these integrator units 109, 119 and D/A converter units 85, 105 carry out the signal processing by switching the positive signal and the negative signal during the operation at the first timing signal Φ1 and the second timing signal Φ2 as well as the third timing signal Φ3 and the fourth timing signal Φ4.

The electric charges output from the pair of sensor electrodes 34 and 35 of sensor element 30 include not only the sensor signals having their phases advanced by 90 degrees to the signal generated in monitor electrode 33 but also undesired signals of the same phase with the monitor signal. In the case wherein the pair of sensor electrodes 34 and 35 of sensor element 30 output composite signals including the sensor signals and undesired signals, this Σ-Δ modulator carriers out the process of so-called synchronous detection on each of the pair of input signals in the same manner as the first exemplary embodiment of the present invention. This process of synchronous detection cancels out the undesired signals so as to integrate the amount of electric charge corresponding to the voltage amplitude of the sensor signals.

The above operation can carry out the Σ-Δ modulation while performing the synchronous detection on the pair of output signals of sensor element 30. It thus becomes possible to obtain the synchronous-detected digital signals without requiring any analog circuit such as a common IV converter circuit, phase shifter and synchronous detector. As a result, there realizes the Σ-Δ type A/D converter of small size at low cost.

Described next pertains to arithmetic operation unit 73 and its operation. First, the one-bit digital signal output from comparator 121 in comparator unit 120 of Σ-Δ modulator 123 is latched in D-type flip-flop 68 of latching circuit 67 in response to the second timing signal Φ2. The other one-bit digital signal also output from comparator 121 in comparator unit 120 of Σ-Δ modulator 123 is latched in D-type flip-flop 69 of latching circuit 67 in response to the fourth timing signal Φ4.

As discussed above, the pair of one-bit digital signals latched in this pair of D-type flip-flops 68 and 69 are the signals of digital values individually converted by Σ-Δ modulation of the electric charges of values equivalent to the positive and negative values in voltage amplitude of the signals output from sensor electrodes 34 and 35 of sensor element 30 with their undesired signals removed. In addition, the two integrator units and D/A converter units carry out the signal processing by switching the positive signal and the negative signal during the operation at the first timing signal Φ1 and the second timing signal Φ2 as well as the third timing signal Φ3 and the fourth timing signal Φ4. There are influences of the same polarity exerted on the pair of one-bit digital signals attributed to fluctuations of the reference voltages and variations of the offset in the individual unit components due to fluctuations of the supply voltage and changes in the temperature. It is noted here that one-bit differential operation unit 70 provided in arithmetic operation unit 73 computes a difference in the result of processing the pair of input signals. This computing process cancels out the influences of the fluctuations of the reference voltages and the like in the individual unit components. In addition, other influences such as the in-phase transient noise components and offset components contained in the pair of input signals output from the pair of sensor electrodes 34 and 35 of sensor element 30 and input to the Σ-Δ type A/D converter can also be canceled out, thereby making it possible to form the signal having twice the amplitude of the difference between the pair of input signals.

Third Exemplary Embodiment

Description is provided hereinafter of an angular velocity sensor using a Σ-Δ type A/D converter according to the third exemplary embodiment of the present invention with reference to the accompanying drawings. Like reference marks are used to designate like structural components as those of the previously described first exemplary embodiment of this invention and their details will be omitted.

Figure 5:
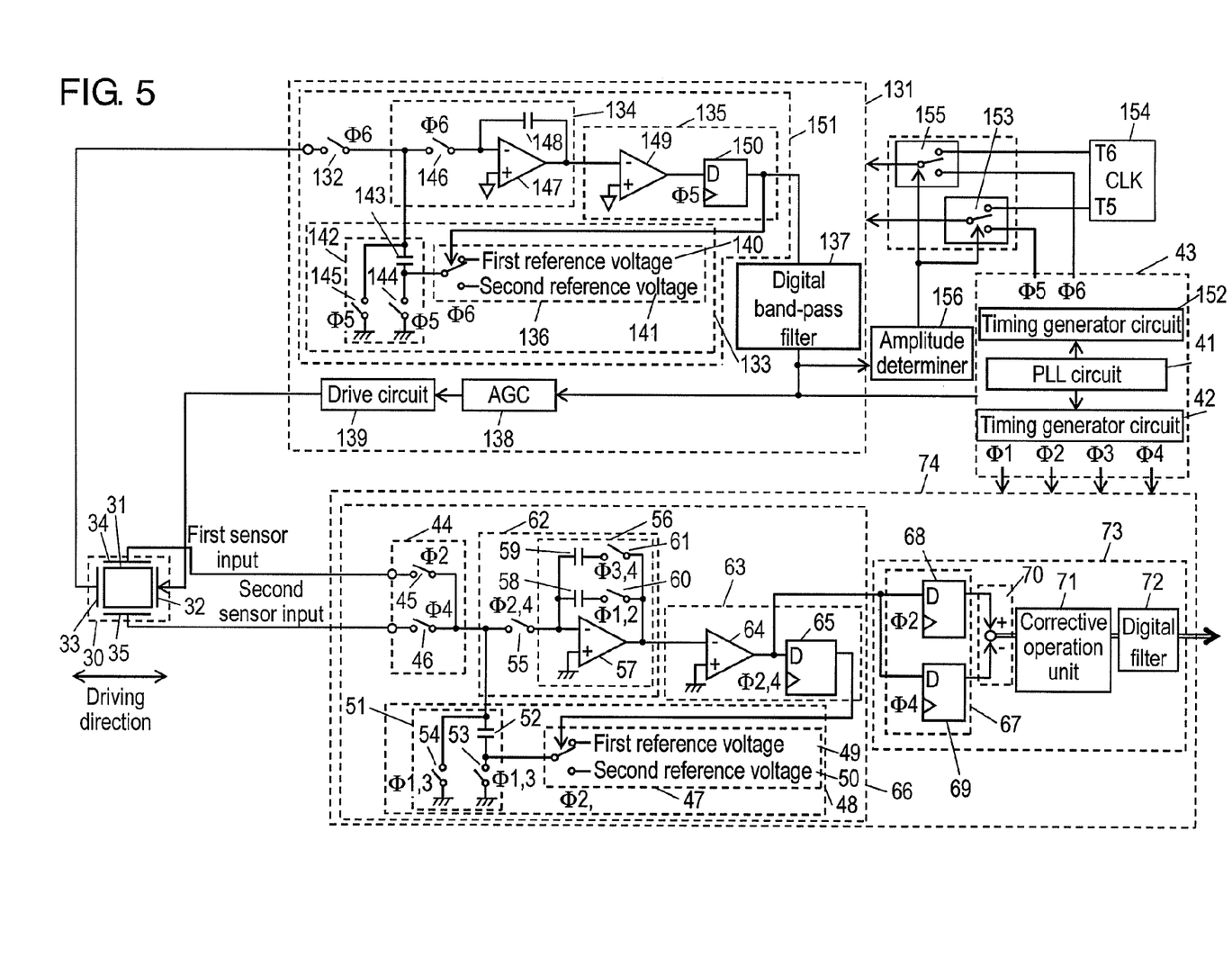
FIG. 5 is a circuit diagram of an angular velocity sensor using a Σ-Δ type A/D converter according to a third exemplary embodiment of the present invention.
Figure 6:
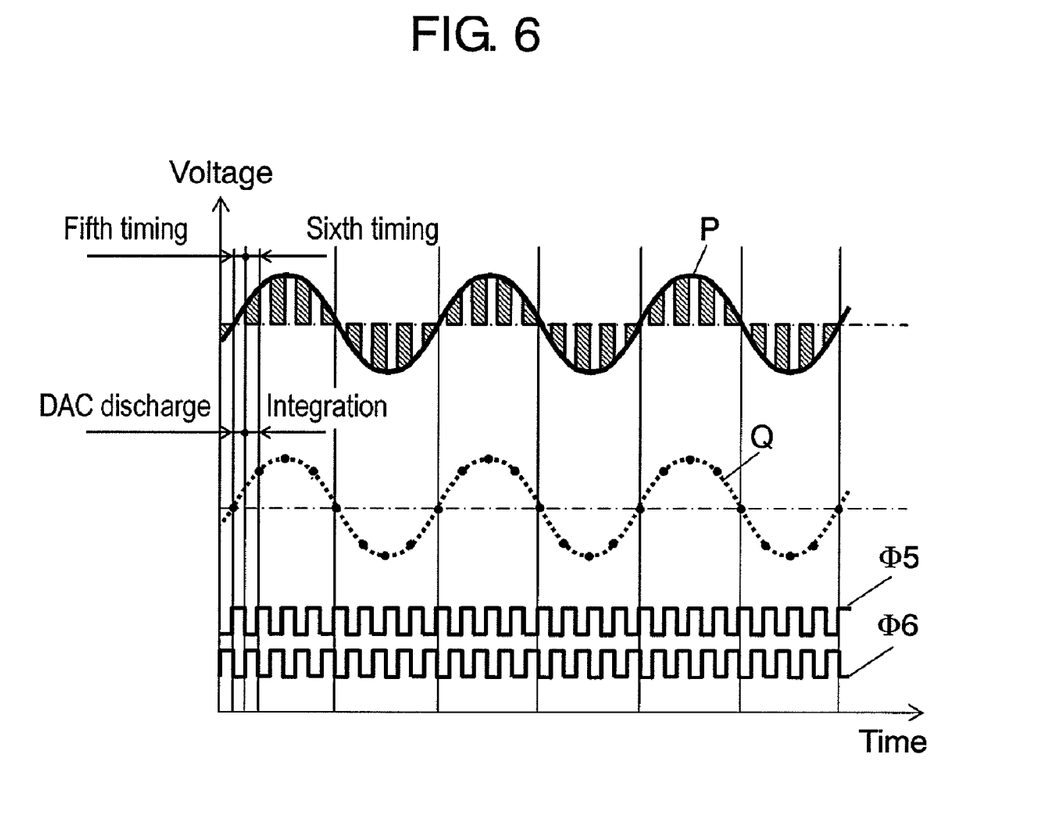
FIG. 6 is a graphical representation showing operating modes of the angular velocity sensor using the Σ-Δ type A/D converter according to the third exemplary embodiment of the present invention.

FIG. 5 is a circuit diagram of the angular velocity sensor using the Σ-Δ type A/D converter according to the third exemplary embodiment of this invention. FIG. 6 is a graphical representation showing operating modes of the angular velocity sensor using the Σ-Δ type A/D converter according to the third exemplary embodiment of the invention. Driver circuit 131 in FIG. 5 comprises input switching device 132, D/A converter unit 133, integrator unit 134, comparator unit 135, D/A switching device 136, digital band-pass filter 137, AGC circuit 138 and drive circuit 139.

Input switching device 132 comprises an analog switch connected with monitor electrode 33 of vibrator element 31, and operating in response to sixth timing signal Φ6 shown in FIG. 6. D/A switching device 136 has first reference voltage 140 and second reference voltage 141, and it selectively switches these first reference voltage 140 and second reference voltage 141 in response to a predetermined signal. It outputs any of a signal of first reference voltage 140 and a signal of second reference voltage 141 in response to sixth timing signal Φ6. DA output unit 142 comprises capacitor 143 for receiving a signal output from D/A switching device 136, and analog switches 144 and 145. Analog switches 144 and 145 are connected to each end of capacitor 143 and operate in response to fifth timing signal Φ5 shown in FIG. 6 to discharge an electric charge in capacitor 143. D/A converter unit 133 comprises D/A switching device 136 and D/A output unit 142. This D/A converter unit 133 discharges the electric charge in capacitor 143 in response to the fifth timing signal Φ5, and it inputs and outputs an electric charge of a value corresponding to the reference voltage output by D/A switching device 136 based on the sixth timing signal Φ6. Analog switch 146 receives the outputs of input switching device 132 and D/A converter unit 133, and outputs them according to the sixth timing signal Φ6.

Integrator unit 134 receives an output of analog switch 146, and it comprises operational amplifier 147 and capacitor 148 connected in a feedback path of this operational amplifier 147. Integrator unit 134 operates in response to the sixth timing signal Φ6, wherein capacitor 148 integrates a signal input to integrator unit 134 and holds an integrated value. This integrated value is output in response to the fifth timing signal Φ5.

Comparator unit 135 receives an integration signal output from integrator unit 134, and it comprises comparator 149 for comparing this integration signal with a predetermined value and D-type flip-flop 150 receiving a one-bit digital signal output from this comparator 149. D-type flip-flop 150 latches the one-bit digital signal and outputs it at a rising period of the fifth timing signal Φ5. This latch signal is input to D/A switching device 136 in D/A converter unit 133, and switches between first reference voltage 140 and second reference voltage 141. Σ-Δ converter 151 comprises input switching device 132, D/A converter unit 133, integrator unit 134 and comparator unit 135. An output voltage from D-type flip-flop 150 is input to band-pass filter 137. Band-pass filter 137 extracts only a resonant frequency component of vibrator element 31 and outputs a sinusoidal wave with noise components removed as shown by waveform P in FIG. 6. An output signal of digital band-pass filter 137 is input to half-wave rectification and smoothing circuit (not shown) provided in AGC circuit 138 and converted into a DC signal.

When this DC signal is too large in amplitude, AGC circuit 138 sends a signal to drive circuit 139 to attenuate the output signal of digital band-pass filter 137 in driver circuit 131. If the DC signal is too small in amplitude, on the other hand, AGC circuit 138 sends another signal to drive circuit 139 to amplify the output signal of digital band-pass filter 137 in driver circuit 131. Accordingly, vibrator element 31 can be controlled in a manner to maintain constant amplitude of vibration by virtue of the above operation.

A sinusoidal wave signal Q shown in FIG. 6 is input to timing control circuit 43. Timing generator circuit 152 generates the fifth timing signal Φ5 and sixth timing signal Φ6 shown in FIG. 6 based on the signal multiplied by PLL circuit 41. These timing signals Φ5 and Φ6 are input to Σ-Δ modulator 151 in driver circuit 131 as switch-timing signals for input switching device 132, D/A switching device 136, analog switch 144, analog switch 145 and analog switch 146.

First timing setting switch 153 receives the fifth timing signal Φ5 from timing generator circuit 152 in timing control circuit 43 and timing signal T5 from clock 154. The fifth timing signal Φ5 and timing signal T5 of clock 154 are of generally the same frequency. Likewise, second timing setting switch 155 receives the sixth timing signal Φ6 of opposite phase to the fifth timing signal Φ5 from timing generator circuit 152 in timing control circuit 43 and sixth timing signal T6 from clock 154. The sixth timing signal Φ6 and timing signal T6 of clock 154 are of generally the same frequency.

Amplitude determiner circuit 156 receives an output signal of digital band-pass filter 137. Amplitude determiner circuit 156 monitors an amplitude of the output signal output from digital band-pass filter 137. When this amplitude is determined as being 75% or larger than a target amplitude level of AGC circuit 138, amplitude determiner circuit 156 switches both first timing setting switch 153 and second timing setting switch 155 in a manner to choose output signals Φ5 and Φ6 of timing generator circuit 152 as clock signals for the purpose of setting the switch timings for input switching device 132, D/A switching device 136, analog switch 144, analog switch 145 and analog switch 146 in driver circuit 131. When this amplitude is determined as being 75% or smaller than a target amplitude level of AGC circuit 138, on the other hand, amplitude determiner circuit 156 switches both first timing setting switch 153 and second timing setting switch 155 in a manner to choose output signals T5 and T6 of clock 154 as clock signals for setting the switch timings for input switching device 132, D/A switching device 136, analog switch 144, analog switch 145 and analog switch 146 in driver circuit 131.

According to the third exemplary embodiment of the present invention, the Σ-Δ type A/D converter comprises input switching device 132 for turning on and off the signal output from monitor electrode 33 of vibrator element 31 to driver circuit 131, D/A converter unit 133 for outputting at least two levels of electric charges, integrator unit 134 for integrating the electric charge output from input switching device 132 and D/A converter unit 133 and holding the integrated value, comparator unit 135 for comparing the integrated value output from integrator unit 134 with a predetermined value, D/A switching device 136 for switching the output of D/A converter unit 133 according to the output of comparator unit 135, digital band-pass filter 137, AGC circuit 138 and drive circuit 139. This configuration hence achieves substantial downsizing of driver circuit 131 since the majority of it can be composed only of digital circuit components and an overall volume of driver circuit 131 reduced as compared with driver circuit 131 otherwise composed entirely of analog circuit components.

INDUSTRIAL APPLICABILITY

The Σ-Δ type A/D converter and the angular velocity sensor using the same according to the present invention have an advantageous feature of canceling out the influence of fluctuations of the reference voltages and the like in the output signals from the input switching device, the D/A converter unit, the integrator unit, the comparator unit and the D/A switching device, and they are therefore useful for such applications as the EA type A/D converter and angular velocity sensor for attitude control and navigation system of a mobile object such as aircraft and motor vehicle.

The invention claimed is:

1. A sigma-delta analog-to-digital converter comprising:
   an input switching device for switching between a first input signal and a second input signal;
   a digital-to-analog converter unit for outputting a first level of electric charge and a second level of electric charge;
   an integrator unit for integrating outputs from the input switching device and the digital-to-analog converter unit and holding integrated values;
   a comparator unit for comparing integrated values output from the integrator unit with a predetermined value;
   a digital-to-analog switching device for switching an output of the digital-to-analog converter unit according to an output of the comparator unit; and
   an arithmetic operation unit for performing computation on an output signal of the comparator unit, wherein
   the comparator unit latches an integrated value held in a first capacitor of the integrator unit at a start of a second period and outputs a value latched at the start of the second period, and latches an integrated value held in a second capacitor of the integrator unit at a start of a fourth period and outputs a value latched at the start of the fourth period, and
   the arithmetic operation unit includes a differential operation unit for computing a difference of at least two comparison signals output from the comparator unit.

2. The sigma-delta analog-to-digital converter of claim 1, wherein the differential operation unit generates a one-bit differential signal by performing one-bit differential operation on a pair of the comparison signals.

3. The sigma-delta analog-to-digital converter of claim 2, wherein the arithmetic operation unit further includes a corrective operation unit for multiplying the one-bit differential signal by predetermined correction data.

4. The sigma-delta analog-to-digital converter of claim 1, further comprising a timing control circuit for switching between the input switching device and the integrator unit according to a phase of a predetermined input signal.

5. The sigma-delta analog-to-digital converter of claim 4, wherein the timing control circuit includes a phase-locked loop circuit.

6. An angular velocity sensor comprising:
   a sensor element having a driver electrode, a plurality of sensor electrodes and a monitor electrode;
   a driver circuit for driving the sensor element with a predetermined driving frequency; and
   a sigma-delta analog-to-digital converter comprising:
      an input switching device for switching between a first input signal and a second input signal from the sensor electrodes;
      a digital-to-analog converter unit for outputting a first level of electric charge and a second level of electric charge;
      an integrator unit for integrating outputs from the input switching device and the digital-to-analog converter unit and holding integrated values;
      a comparator unit for comparing integrated values output from the integrator unit with a predetermined value;
      a digital-to-analog switching device for switching an output of the digital-to-analog converter unit according to an output of the comparator unit; and
      an arithmetic operation unit for performing computation on an output signal of the comparator unit, wherein
      the comparator unit latches an integrated value held in a first capacitor of the integrator unit at a start of a second period and outputs a value latched at the start of the second period, and latches an integrated value held in a second capacitor of the integrator unit at a start of a fourth period and outputs a value latched at the start of the fourth period, and
      the arithmetic operation unit includes a differential operation unit for computing a difference of at least two comparison signals output from the comparator unit.

7. An angular velocity sensor of claim 6, wherein the differential operation unit generates a one-bit differential signal by performing one-bit differential operation on a pair of the comparison signals.

8. The angular velocity sensor of claim 7, wherein the arithmetic operation unit further includes a corrective operation unit for computing the one-bit differential signal with predetermined correction data.

9. The angular velocity sensor of claim 6 further comprising a timing control circuit for switching among the input switching device, the integrator unit and the arithmetic operation unit according to a phase of a predetermined input signal.

10. The angular velocity sensor of claim 9, wherein the timing control circuit includes a phase-locked loop circuit.

* * * * *